United States Patent
Jain

(10) Patent No.: US 11,463,077 B2
(45) Date of Patent: Oct. 4, 2022

(54) LOW POWER COMPARATOR

(71) Applicant: Texas Instruments Incorporated, Dallas, TX (US)

(72) Inventor: Dinesh Jain, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 466 days.

(21) Appl. No.: 15/164,283

(22) Filed: May 25, 2016

(65) Prior Publication Data
US 2017/0346472 A1    Nov. 30, 2017

(51) Int. Cl.
*H03K 5/22* (2006.01)
*H03K 5/24* (2006.01)
*H03K 5/08* (2006.01)

(52) U.S. Cl.
CPC ............. *H03K 5/2481* (2013.01); *H03K 5/08* (2013.01)

(58) Field of Classification Search
CPC ....... H03K 19/00361; H03K 19/00315; H03K 19/00384; H03K 19/0005; H04L 25/028; H04L 25/0272; H04L 25/0292; G06F 13/4072
USPC .................. 327/63–65, 108, 112; 326/82–83
See application file for complete search history.

(56) References Cited

U.S. PATENT DOCUMENTS

| | | | | |
|---|---|---|---|---|
| 3,914,702 A * | 10/1975 | Gehweiler | ............ | H03F 1/0233 326/121 |
| 3,991,380 A * | 11/1976 | Pryor | .................. | H03F 3/45237 330/253 |
| 5,835,420 A * | 11/1998 | Lee | ........................ | G11C 5/147 365/189.09 |
| 6,144,232 A * | 11/2000 | Yukawa | ................. | H03K 5/249 327/337 |
| 6,304,141 B1 * | 10/2001 | Kennedy | ............... | H03F 3/3028 330/253 |
| 6,603,348 B1 * | 8/2003 | Preuss | ................. | H03F 3/45179 326/30 |
| 6,642,790 B2 * | 11/2003 | Schrodinger | ....... | H03F 3/45237 330/253 |
| 7,236,018 B1 * | 6/2007 | Wang | .................... | H03F 1/0205 326/83 |
| 2004/0155680 A1 * | 8/2004 | Icking | .............. | H03K 19/01707 326/83 |
| 2007/0279105 A1 * | 12/2007 | Sunairi | .......... | H03K 19/018528 327/108 |
| 2010/0019841 A1 * | 1/2010 | Agarwal | ................. | H03F 3/005 330/9 |

\* cited by examiner

*Primary Examiner* — Quan Tra
(74) *Attorney, Agent, or Firm* — Michelle F. Murray; Charles A. Brill; Frank D. Cimino

(57) ABSTRACT

A comparator includes an input stage having a differential input and an output, wherein the voltage at the output is in response to the voltage at the input. The comparator further includes a current limiter for limiting the current flow through the input stage, wherein the current flow through the input stage is in response to the voltage at the input.

15 Claims, 2 Drawing Sheets

LOW POWER COMPARATOR

BACKGROUND

Analog-to-digital converters (ADCs) convert analog input signals, such as input voltages and input currents, to digital signals or digital words. In asynchronous ADCs, the input signal is typically not sampled. Instead of being sampled, the input signal is continuously compared to a reference signal, which could be stationary or continuous. An example of a stationary reference is a DC voltage or current and an example of a continuous reference is a ramp function. Due to the nature of the continuous mode, a comparator that performs the comparison has to operate in continuous mode, which is a mode without a clock.

The ADC generates data recording the digital signal and a timestamp of when the digital signal was generated. The data with the two pieces of information is sometimes referred to as a two-tuple. The two-tuple generated by asynchronous conversion has to be accurate, otherwise the time stamp and/or digital signals generated by the ADC will not reflect the analog input signals from which they are generated.

The comparator in an ADC has some time delay, which is dependent on the rate of change of input signal and the difference in voltages of the inputs of the comparator. This difference in voltages is also known as the overdrive at the input. To maintain the accuracy of the two-tuple (data-word and timestamp), the variation in the time-stamp has to be minimized and it has to be within predetermined limits for a wide-band input signal. Therefore, a need exists for a high speed, low time distortion comparator to achieve high conversion accuracy.

SUMMARY

A comparator includes an input stage having a differential input and an output, wherein the voltage at the output is in response to the voltage at the input. The comparator further includes a current limiter for limiting the current flow through the input stage, wherein the current flow through the input stage is in response to the voltage at the input.

DETAILED DESCRIPTION

An analog-to-digital converter (ADC) converts an analog input such as a voltage or a current to a digital output, which may be a digital signal such as a plurality of digital words. In a typical linear ADC, the lowest digital word that may be generated by the ADC is mapped to the lowest analog signal that may be input to the ADC. The highest digital word that may be generated by the ADC is mapped to the highest analog signal that may be input to the ADC. The input analog signal is bounded by at least the high and low operating voltages of the ADC. The intermediate analog input signals are mapped linearly and quantized to the digital signals generated by the ADC.

In a conventional ADC, the analog input signal is sampled into a digital-to-analog converter (DAC). The output of the DAC is coupled to a clocked comparator, wherein comparisons are made by the clocked comparator at specific times based on a clock signal. The clocked comparator is polled at a specific time during the clock period for a decision as to whether the input signal is greater or less than a predetermined signal. The comparison process continues based on the outcome of the clocked comparator.

In an asynchronous ADC, the analog input signal is not sampled as with conventional ADCs where the input signal is sampled at specific times. In asynchronous ADCs, the analog input is compared to a reference signal, which may be stationary or continuous. A stationary reference includes DC reference signals and a continuous reference includes AC reference signals. The comparator in an asynchronous ADC has to operate in continuous mode, meaning that it generates an output upon the input signal equaling the reference signal without a clock determining when sampling occurs. In order to achieve accurate analog-to-digital conversion, the two-tuple of the digital word and a time stamp generated by the ADC has to be accurate. Any delay of the comparator results in inaccuracies in the analog-to-digital conversion. The delay in the comparator is dependent upon the slope of the analog input signal, which is related to the frequency characteristics of the input signal and the overdrive at the input. The comparator has some time delay, which is dependent on the rate of change of input signal and the difference in voltages of the inputs of the comparator. This difference in voltages at the input of the comparator is also known as the overdrive at the input.

Figure 1:
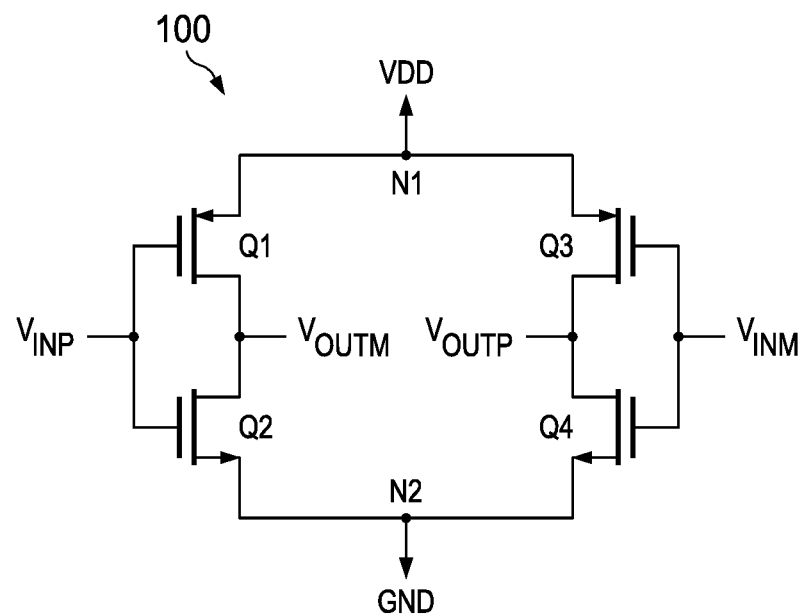
FIG. 1 is a schematic diagram of a conventional single stage comparator.

FIG. 1 is a schematic diagram of a conventional comparator 100. The comparator 100 operates from a voltage VDD that is referenced to a ground potential GND. The comparator 100 has differential inputs consisting of a non-inverting input $V_{INP}$ and an inverting input $V_{INM}$. The comparator 100 also has differential outputs consisting of an output $V_{OUTP}$ and an output $V_{OUTM}$. When the voltage at the non-inverting input $V_{INP}$ is greater than the voltage at the inverting input $V_{INM}$, the voltage at the output $V_{OUTP}$ is greater than the voltage at the output $V_{OUTM}$. For example, the voltage at the output $V_{OUTP}$ may be close to the VDD voltage potential and the voltage at the output $V_{OUTM}$ may be close to the ground potential. Likewise, when the voltage at the non-inverting input $V_{INP}$ is less than the voltage at the inverting input $V_{INM}$, the voltage at the output $V_{OUTP}$ is less than the voltage at the output $V_{OUTM}$.

The comparator 100 includes transistors Q1, Q2, Q3, and Q4. All the transistors described herein are metal oxide semiconductor field-effect transistors (MOSFETs). Other types of transistors as appreciated by those skilled in the art may be used in place of the MOSFETs described herein. The differential non-inverting input $V_{INP}$ is coupled to the gates of transistors Q1 and Q2. In a similar manner, the differential inverting input $V_{INM}$ is coupled to the gates of the transistors Q3 and Q4. The transistors Q1 and Q3 are P-channel devices with their sources coupled to a node N1. The transistors Q2 and Q4 are N-channel devices with their sources coupled to a node N2.

As shown in FIG. 1, the sources of transistors Q1 and Q3 are coupled to VDD by way of the node N1 and the sources of transistors Q2 and Q4 are coupled ground GND by way of the node N2. This configuration of a conventional comparator has several drawbacks. For example, the comparator 100 is not fully differential because it does not have any common node or virtual ground. Furthermore, the current drawn through the comparator 100 is a strong function of the voltage difference between VDD and ground and the magnitude of the voltage transitions at the inputs $V_{INP}$ and $V_{INM}$. In addition, the comparator 100 is susceptible to common mode voltage variation between the voltages at the inputs $V_{INP}$ and $V_{INM}$. Due to these shortcomings, the delay distortion of comparators such as the comparator 100 is high which makes them impractical for some asynchronous ADC devices.

Comparators that overcome the above-described problems with delay and that operate at a low or consistent current draw are described herein. In order to minimize the delay in comparators, the bandwidth of the comparators has to be based on the input signal characteristics. Furthermore, the gain of the comparators should be as high as the initial accuracy requirement and large signal distortion requirement of the input signal.

Figure 2:
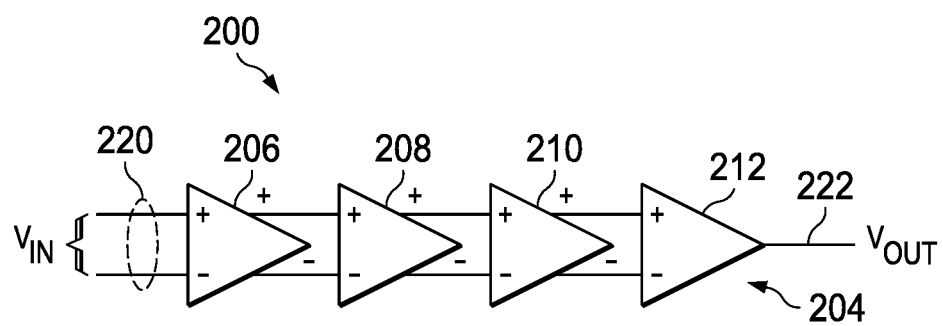
FIG. 2 is a schematic diagram of a multi-stage comparator.

FIG. 2 is a schematic diagram of a multi-stage comparator 200 that is referred to as a comparator network 200. The comparator network 200 includes a plurality of individual comparators 204 that are coupled in series. The comparators 204 are referred to individually as the first comparator 206, the second comparator 208, the third comparator 210, and the fourth comparator 212. The first comparator 206 is coupled to an input 220, which in the example of FIG. 2 is a voltage input and has an input voltage $V_{IN}$ present during operation of the comparator network 200. The output 222 of the comparator network 200 is the output of the last comparator, which in the example of FIG. 2 is the fourth comparator 212. All of the comparators 204 have differential inputs and all of the comparators except the forth comparator 212 have differential outputs. In some examples, the fourth comparator 212 also has a differential output.

The use of the plurality of comparators 204 achieves the high gain and bandwidth required for many applications. Due to multi-stage nature of the comparator network 200, each of the comparators 204 has high bandwidth and low distortion characteristics. It is known that in a given semiconductor process, the product of gain and achievable bandwidth is constant. In order to achieve the maximum gain-bandwidth product, a multi-stage comparator scheme is used, which enables cascading multiple comparator stages with lower gain and higher bandwidth. The successive comparator stages might have different design criteria than the previous one, which results in maximization of bandwidth with lower large signal distortion.

Figure 3:
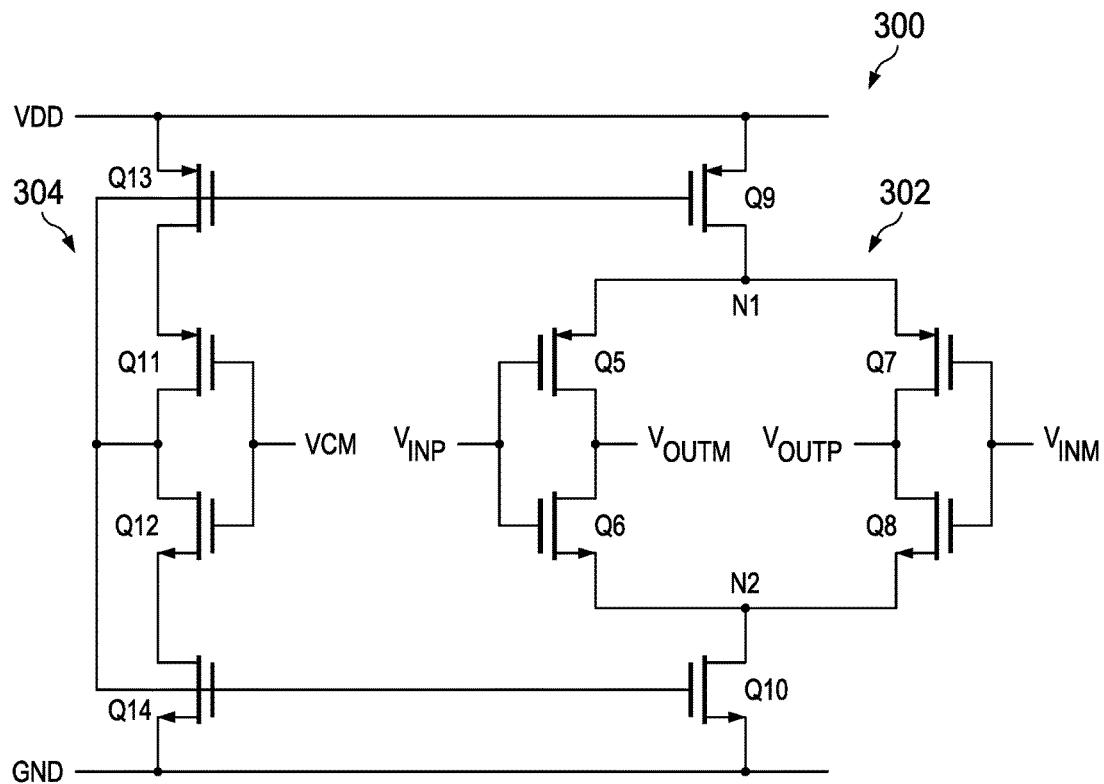
FIG. 3 is a schematic diagram of an example circuit of one of the comparators of FIG. 2.

Additional reference is made to FIG. 3, which is a schematic diagram of an example comparator 300 of one of the comparators 204. The output of the comparator 300 can be differential or single ended, so the comparator 300 described below can be implemented as any of the comparators 204. The comparator 300 has an input stage 302 and a bias stage 304. The comparator 300, including both stages 302 and 304, operates from a voltage VDD that represents the high power supply of the comparators 204. A ground potential GND represents the low power supply of the comparators 204. The input stage 302 has differential inputs consisting of a non-inverting input $V_{INP}$ and an inverting input $V_{INM}$. The input stage 302 also has differential outputs consisting of an output $V_{OUTP}$ and an output $V_{OUTM}$.

The input stage 302 includes transistors Q5, Q6, Q7, and Q8. All the transistors described herein are field-effect transistors (FETs), such as metal oxide semiconductor field-effect transistors (MOSFETs). Other types of transistors as appreciated by those skilled in the art may be used in place of the MOSFETs described herein. The non-inverting input $V_{INP}$ is coupled to the gates of transistors Q5 and Q6. In a similar manner, the inverting input $V_{INM}$ is coupled to the gates of the transistors Q7 and Q8. The transistors Q5 and Q7 are P-channel devices with their sources coupled to a node N1. The transistors Q6 and Q8 are N-channel devices with their sources coupled to a node N2.

The comparator 300 overcomes the problems described above by biasing the input stage 302 as shown in FIG. 3. The comparator 300 includes current limiters that limit the current flow through the input stage 302. In the example of FIG. 3, the current limiters are two transistors Q9 and Q10. Transistor Q9 is coupled between the voltage VDD and the node N1 and transistor Q10 is coupled between the node N2 and ground GND. The gates of transistors Q9 and Q10 are coupled to the bias stage 304. As shown in FIG. 3 and described below, the current enabled to pass through the transistors Q9 and Q10 is a function of a common mode voltage $V_{CM}$. The common-mode voltage $V_{CM}$ is the arithmetic mean of the voltages at the inputs $V_{INP}$ and $V_{INM}$. In addition to providing current limitation, the transistors Q9 and Q10 further provide a virtual ground for the input stage 302 as described further below.

The bias stage 304 includes transistors Q11, Q12, Q13, and Q14. The bias current through transistors Q11 and Q12 is set by the common mode voltage $V_{CM}$. The connection of transistors Q11, Q12, Q13, and Q14 also makes sure that the differential output voltage $V_{OUTM}/V_{OUTN}$ is equal to the common mode voltage $V_{CM}$. When the voltages $V_{INP}$ and $V_{INM}$ are equal to the common mode voltage $V_{CM}$, the output voltage is equal to the common mode voltage $V_{CM}$. When the input voltages $V_{INP}$ and $V_{INM}$ are not equal to the common mode voltage $V_{CM}$, the output voltage is centered around the common mode voltage $V_{CM}$. The common mode voltage $V_{CM}$ is input to the gates of transistors Q11 and Q12, which have different channels. For example, in the embodiment of FIG. 3, transistor Q11 is a P-channel device and transistor Q12 is an N-channel device. The drains of transistors Q11 and Q12 are coupled to the gates of transistors Q9, Q10, Q13, and Q14 to limit the current through the input stage 304.

The comparator 300 receives the input voltages at the inputs $V_{INP}$ and $V_{INM}$. The common mode voltage $V_{CM}$ is determined or calculated as the arithmetic mean of the input voltages $V_{INP}$ and $V_{INM}$. In the following example, the aspect ratio (W/L) of Q9/Q13=Q10/Q14=2*Q5/Q11=2*Q7/Q11=2*Q6/Q12=2*Q8/Q12. In one application of this example, the input voltages $V_{INP}$ and $V_{INM}$ are equal to the common mode voltage $V_{CM}$. As a result of the input voltages $V_{INP}$ and $V_{INM}$ equaling the common mode voltage $V_{CM}$, current flowing through transistors Q9 and Q10 is ratiometrically related to the current flow through transistors Q13 and Q14 and sets the current limit of the comparator 300. Half of the current flowing through transistors Q9 and Q10 flows through the branch consisting of transistors Q5 and Q6 and the other half of the current flows through the branch consisting of transistors Q7 and Q8. This current flow sets the maximum biasing condition of the comparator 300 at the cross-over point of the input. When $V_{INP}$ is greater than $V_{INM}$, transistor Q6 gradually turns on more than transistor Q5, thereby pulling the output voltage $V_{OUTM}$ lower. Similarly, transistor Q7 gradually turns on more than transistor Q8, which pulls the output voltage $V_{OUTP}$ higher. During this operation, nodes N1 and N2 act as virtual ground nodes. The voltages at nodes N1 and N2 diverge, which reduces the total current through the comparator 300.

Figure 4:
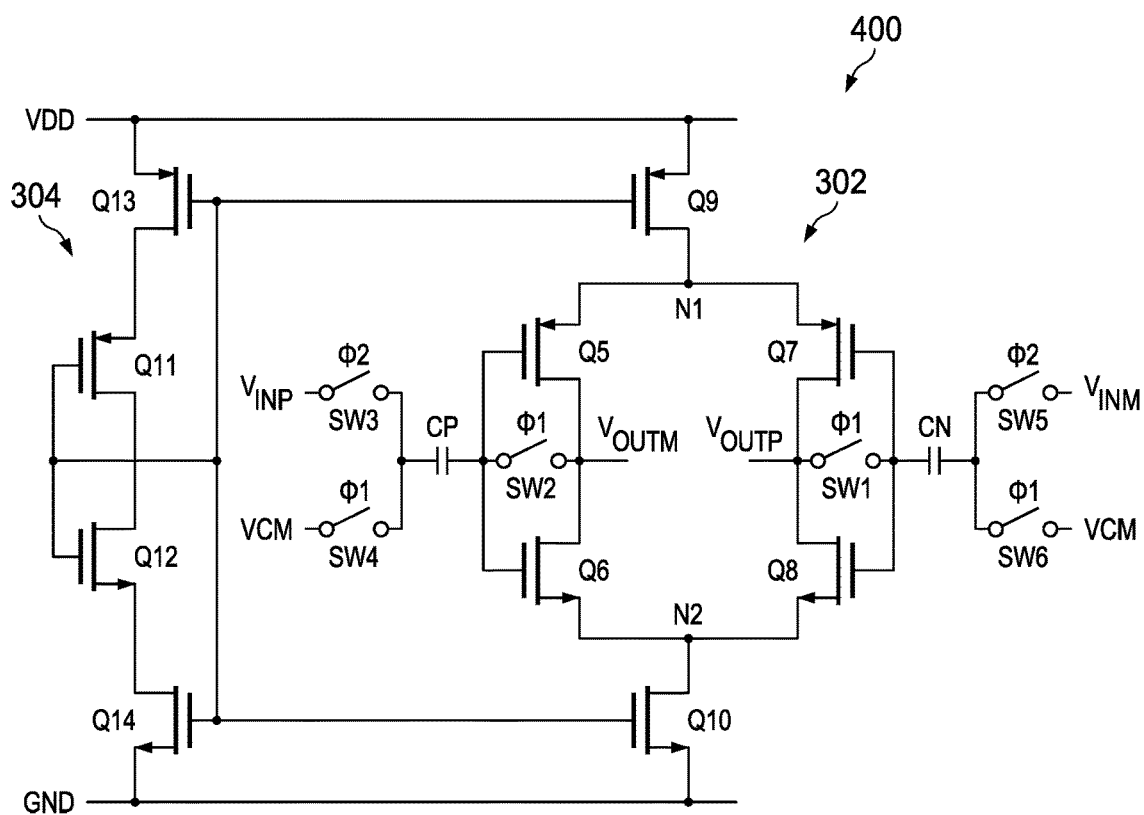
FIG. 4 is a schematic diagram of an example circuit of one of the comparators of FIG. 2 with self biasing.

FIG. 4 is a schematic diagram of an example comparator 400 that is representative of one of the comparators 204 of FIG. 2. The comparator 400 includes circuitry for self biasing. The comparator 400 is similar to the comparator 300 of FIG. 3 and references many of the same reference numerals as the comparator 300. The comparator 400 couples the common mode voltage $V_{CM}$ to the input stage 302 as described below. The comparator 400 includes a switch SW1 that couples the output $V_{OUTP}$ to a capacitor $C_N$. A switch SW2 couples the output $V_{OUTM}$ to a capacitor $C_P$. The capacitor $C_N$ is coupled to the gates of transistors Q7 and Q8 and the capacitor $C_P$ is coupled to the gates of transistors Q5 and Q6. The switches SW1 and SW2 are controlled by a first phase of Φ1 a clock signal.

A switch SW3 couples the input $V_{INP}$ to the capacitor $C_P$. A switch SW4 couples the common mode voltage $V_{CM}$ to the capacitor $C_P$. A switch SW5 couples the input $V_{INM}$ to the capacitor $C_N$. A switch SW6 couples the common mode voltage $V_{CM}$ to the capacitor $C_N$. The switches SW3-SW6 are controlled by a second phase Φ2 of the clock signal. The first and second phases Φ1 and Φ2 of the clock signal are non-overlapping clock phases, so one phase is high while the other phase is low and vise versa. During the periods when the first phase Φ1 is high, the switches SW1, SW2, SW4 and SW6 are closed. By closing switches SW4 and SW6, the common mode voltage $V_{CM}$ is sampled to the one of the plates of the capacitors $C_P$ and $C_N$, respectively. Closing switches SW1 and SW2 samples the common mode of the differential inverter into the other plate of the capacitors $C_P$ and $C_N$. In some examples, the switches SW4 and SW6 are not required because the inputs are reset to common mode during phase Φ1. Closing switches SW1, SW2, SW4 and SW6 also removes any offset due to mismatch between the two sides of the input stage 302, resulting in self biasing. During the second phase Φ2 of the clock cycle, switches SW3 and SW5 are closed and the other switches are open. During the second phase Φ2, the comparator 400 functions as the comparator 300, FIG. 3, as described above.

While some examples of comparators have been described in detail herein, it is to be understood that the inventive concepts may be otherwise variously embodied and employed and that the appended claims are intended to be construed to include such variations except insofar as limited by the prior art.

What is claimed is:

1. A comparator comprising:
an input stage having a differential input terminal and a differential output terminal, the input stage comprising:
a first transistor coupled in series with a second transistor, wherein a first input terminal of the differential input terminal is coupled to a first gate of the first transistor and to a second gate of the second transistor;
a third transistor coupled in series with a fourth transistor, wherein a second input terminal of the differential input terminal is coupled to a third gate of the third transistor and to a fourth gate of the fourth transistor;
a bias stage comprising:
a first biasing transistor; and
a second biasing transistor; and
a current limiter coupled to the input stage and to the bias stage, the current limiter comprising:
a first current limiter transistor coupled between a power terminal and the input stage;
a second current limiter transistor coupled between a ground terminal and the input stage, wherein the input stage is coupled between the first current limiter transistor and the second current limiter transistor;
a third current limiter transistor coupled between the power terminal and the bias stage; and
a fourth current limiter transistor coupled between the ground terminal and the power terminal, wherein the third current limiter transistor, the first biasing transistor, the second biasing transistor, and the fourth current limiter transistor are coupled in series, wherein a gate of the fourth current limiter transistor is coupled to a gate of the first current limiter transistor, a gate of the second current limiter transistor, a gate of the third current limiter transistor, a gate of the first biasing transistor, and a gate of the second biasing transistor, and wherein the gate of the first biasing transistor is not directly externally tied to either a drain or to a source of the first biasing transistor.

2. The comparator of claim 1, wherein the input stage, the first current limiter transistor, and the second current limiter transistor are coupled in series between the power terminal and the ground terminal.

3. The comparator of claim 1, wherein
the first transistor has a first channel type, wherein the second transistor has a second channel type, wherein the first channel type is different than the second channel type,
the third transistor has the first channel type, wherein the fourth transistor has the second channel type.

4. The comparator of claim 1, wherein the differential output terminal has a first output terminal and a second output terminal, wherein the first output terminal is coupled to a drain or a source of the first transistor and to a drain or a source of the second transistor, and wherein the second output terminal is coupled to a drain or a source of the third transistor and to a drain or a source of the fourth transistor.

5. The comparator of claim 1, wherein the bias stage is configured to set a current limit of the current limiter.

6. The comparator of claim 1, wherein:
the first current limiter transistor is a field-effect transistor (FET); and
the second current limiter transistor is a FET.

7. The comparator of claim 1, further comprising auto biasing circuitry, the auto biasing circuitry comprising:
a first capacitor having a first terminal coupled to a gate of the first transistor and to a gate of the second transistor;
a second capacitor having a second terminal coupled to a gate of the third transistor and to a gate of the fourth transistor;
a first switch coupled between a common mode voltage and a third terminal of the first capacitor;
a second switch coupled between the common mode voltage and a fourth terminal of the second capacitor;
a third switch coupled between the first input terminal of the differential input terminal and the third terminal of the first capacitor; and
a fourth switch coupled between the second input terminal of the differential input terminal and the fourth terminal of the second capacitor;
wherein the first switch and the second switch are configured to open and close together; and
wherein the third switch and the fourth switch are configured to open and close together.

8. The comparator of claim 7, further comprising:
a fifth switch coupled between the first terminal of the first capacitor and a first output terminal of the differential output terminal; and
a sixth switch coupled between the second terminal of the second capacitor and a second output terminal of the differential output terminal;
wherein the fifth switch and the sixth switch are configured to open and close with the first switch and the second switch.

9. A comparator comprising:
an input stage comprising:
   a first pair of transistors coupled in series between a first node and a second node, a first input terminal of a differential input terminal coupled to gates of transistors of the first pair of transistors;
   a second pair of transistors coupled in series between the first node and the second node, a second input terminal of the differential input terminal coupled to gates of transistors of the second pair of transistors;
   a first output terminal of a differential output terminal coupled between the transistors of the first pair of transistors; and
   a second output terminal of the differential output terminal coupled between the transistors of the second pair of transistors;
a current limiter coupled to the input stage, the current limiter comprising:
   a first current limiter transistor coupled between the first node and a first supply voltage terminal;
   a second current limiter transistor coupled between the second node and a second supply voltage terminal, wherein the input stage is coupled between the first current limiter transistor and the second current limiter transistor;
   a third current limiter transistor, a source of the third current limiter transistor coupled to a source of the first current limiter transistor; and
   a fourth current limiter transistor, a source of the fourth current limiter transistor coupled to a source of the second current limiter transistor; and
a bias stage coupled to the current limiter, the bias stage comprising:
   a first biasing transistor, wherein a source of the first biasing transistor is coupled to a drain of the third current limiter transistor; and
   a second biasing transistor coupled in series with the first biasing transistor, wherein a source of the second biasing transistor is coupled to a drain of the fourth current limiter transistor, wherein the third current limiter transistor, the first biasing transistor, the second biasing transistor, and the fourth current limiter transistor are coupled in series, wherein a gate of the fourth current limiter transistor is coupled to a gate of the first current limiter transistor, a gate of the second current limiter transistor, a gate of the third current limiter transistor, a gate of the first biasing transistor, and a gate of the second biasing transistor, and wherein the gate of the first biasing transistor is not directly externally tied to either a drain or to the source of the first biasing transistor.

10. A comparator comprising:
a first pair of transistors coupled in series between a first node of an input stage and a second node of the input stage;
a second pair of transistors coupled in series between the first node of the input stage and the second node of the input stage;
a first output terminal of a differential output terminal coupled between transistors of the first pair of transistors;
a second output terminal of the differential output terminal coupled between transistors of the second pair of transistors;
a first capacitor having a first terminal coupled to gates of the transistors of the first pair of transistors;
a second capacitor having a second terminal coupled to gates of the transistors of the second pair of transistors;
a first switch coupled between a common mode voltage and a second terminal of the first capacitor;
a second switch coupled between the common mode voltage and a second terminal of the second capacitor;
a third switch coupled between a first input terminal of a differential input terminal and the second terminal of the first capacitor;
a fourth switch coupled between a second input terminal of the differential input terminal and the second terminal of the second capacitor;
a first current limiter transistor coupled between the first node of the input stage and a first supply voltage terminal;
a second current limiter transistor coupled between the second node of the input stage and a second supply voltage terminal, wherein the input stage is coupled between the first current limiter transistor and the second current limiter transistor;
a third current limiter transistor coupled to the first current limiter transistor;
a fourth current limiter transistor coupled to the second current limiter transistor; and
biasing circuitry coupled to a gate of the first current limiter transistor and to a gate of the second current limiter transistor, the biasing circuitry comprising:
   a first biasing transistor; and
   a second biasing transistor;
wherein the third current limiter transistor, the first biasing transistor, the second biasing transistor, and the fourth current limiter transistor are coupled in series, wherein a gate of the fourth current limiter transistor is coupled to a gate of the first current limiter transistor, a gate of the second current limiter transistor, a gate of the third current limiter transistor, a gate of the first biasing transistor, and a gate of the second biasing transistor, and wherein the gate of the first biasing transistor is not directly externally tied to either a drain or to a source of the first biasing transistor;
wherein the first switch and the second switch are configured to open and close together; and
wherein the third and the fourth switch are configured to open and close together.

11. The comparator of claim 10, wherein the biasing circuitry is configured to set a current flow through the first current limiter transistor and through the second current limiter transistor.

12. The comparator of claim 9, wherein:
the first node is a first virtual ground node for the input stage; and
the second node is a second virtual ground node for the input stage.

13. The comparator of claim 10, wherein:
the first terminal of the input stage is a first virtual ground node; and the second terminal of the input stage is a second virtual ground node.

14. The comparator of claim 8, wherein:

during a first phase of a clock cycle, the first switch, the second switch, the fifth switch, and the sixth switch are closed and the third switch and the fourth switch are open; and during a second phase of the clock cycle the third switch and the fourth switch are closed and the first switch, the second switch, the fifth switch, and the sixth switch are open.

15. The comparator of claim 1, wherein the comparator is coupled between a second comparator and a third comparator.

\* \* \* \* \*